United States Patent
Nurani et al.

(10) Patent No.: US 10,523,231 B1
(45) Date of Patent: Dec. 31, 2019

(54) DYNAMIC INTEGRATOR WITH BOOSTED OUTPUT IMPEDANCE OF THE TRANSCONDUCTANCE

(71) Applicant: TEXAS INSTRUMENTS INCORPORATED, Dallas, TX (US)

(72) Inventors: Sai Aditya KrishnaSwamy Nurani, Hyderabad (IN); Shagun Dusad, Bengaluru (IN); Visvesvaraya Appala Pentakota, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/233,642

(22) Filed: Dec. 27, 2018

(51) Int. Cl.
*H03M 1/38* (2006.01)
*H03M 1/16* (2006.01)
*H03M 1/12* (2006.01)
*H03M 1/46* (2006.01)

(52) U.S. Cl.
CPC ......... *H03M 1/167* (2013.01); *H03M 1/1245* (2013.01); *H03M 1/468* (2013.01)

(58) Field of Classification Search
CPC .... H03M 1/167; H03M 1/468; H03M 1/1245; H03M 1/12; H03M 1/00

USPC .................................................. 341/155, 161
See application file for complete search history.

(56) References Cited

U.S. PATENT DOCUMENTS

| | | | | |
|---|---|---|---|---|
| 5,847,600 A | * | 12/1998 | Brooks | H03F 3/005 330/9 |
| 6,396,429 B2 | * | 5/2002 | Singer | H03M 1/1245 341/155 |
| 7,310,016 B2 | * | 12/2007 | Chuang | H03F 3/45 330/311 |
| 7,432,763 B2 | * | 10/2008 | Leete | H03F 3/195 330/254 |
| 8,415,933 B2 | * | 4/2013 | Loikkanen | G05F 1/618 323/225 |
| 8,890,612 B2 | * | 11/2014 | Coimbra | H03F 3/45 330/253 |
| 2018/0076807 A1 | * | 3/2018 | Devarajan | H03K 17/005 |

* cited by examiner

*Primary Examiner* — Jean B Jeanglaude
(74) *Attorney, Agent, or Firm* — John R. Pessetto; Charles A. Brill; Frank D. Cimino

(57) ABSTRACT

A pipelined analog-to-digital converter (ADC) circuit includes a first ADC stage and a residue stage coupled to the first ADC stage. The residue stage includes a dynamic integrator configured to provide transconductance, wherein the dynamic integrator includes a boost circuit configured to boost an output impedance of the transconductance.

20 Claims, 9 Drawing Sheets

DYNAMIC INTEGRATOR WITH BOOSTED OUTPUT IMPEDANCE OF THE TRANSCONDUCTANCE

BACKGROUND

Many modern electronic systems involve analog-to-digital converters (ADCs) and/or digital-to-analog converters (DACs). One example ADC topology is referred to as top plate sampling ADC topology. In a top plate sampling ADC topology, an input signal is sampled using a capacitor having a first node coupled to a sampling switch and a second node coupled to ground. In a top plate sampling ADC topology, the front-end circuitry (e.g., a flash stage) receives a full input and provides a multi-bit output that is fed to a multi-bit DAC. The analog output of the DAC is subtracted from the ADC input, and the "residue" of the subtraction is then gained up and is fed to the next stage.

One technique to gain up the residue involves a dynamic integrator. As bandwidths and speeds of ADC operations increase, the time available for integration decreases, which results in increased power consumption to achieve a target gain. Also, a sampling switch at the output of a dynamic integrator presents an additional load that degrades integrator performance.

SUMMARY

In accordance with at least one example of the disclosure, a pipelined analog-to-digital converter (ADC) circuit comprises a first ADC stage and a residue stage coupled to the first ADC stage. The residue stage comprises a dynamic integrator configured to provide transconductance, wherein the dynamic integrator includes a boost circuit configured to boost an output impedance of the transconductance In accordance with at least one example of the disclosure, a dynamic integrator circuit comprises a complementary metal-oxide-semiconductor (CMOS) input stage. The dynamic integrator circuit also comprises a conductance boost circuit coupled to the CMOS input stage. The conductance boost circuit comprises a first pair of differential transistors including a first transistor and a second transistor. The conductance boost circuit also comprises a second pair of differential transistors including a third transistor and a fourth transistor. The conductance boost circuit also comprises a switch arrangement with switches coupled between a bias node and first and second current terminals of each of the first transistor, second transistor, third transistor, and fourth transistor.

BRIEF DESCRIPTION OF THE DRAWINGS

For a detailed description of various examples, reference will now be made to the accompanying drawings in which.

DETAILED DESCRIPTION

Disclosed herein are pipelined analog-to-digital converter (ADC) devices, systems, and methods, involving a residue stage with a dynamic integrator configured to provide a transconductance, and to boost an output impedance of the transconductance. As used herein, a "dynamic integrator" is an integrator with switches. In at least some of the disclosed examples, a dynamic integrator achieves a large gain with very low power consumption and avoids an output sampling switch. In some examples, a dynamic integrator performs a dynamic conductance boost during an initial phase of integration, such that the dynamic conductance boost is insensitive to integration time window jitter.

In at least some of the disclosed examples, a dynamic integrator includes other circuits and/or re-uses available circuits to perform options such as input conductance cancellation, cascade sampling to avoid an output sampling switch, and bias sampling options to reduce sensitivity to the switching frequency of the dynamic integrator. With the disclosed bias sampling option, the dynamic integrator is suitable to aperiodic systems. To provide a better understanding, various options for ADC devices, systems, and methods involving a dynamic integrator are described using the figures as follows.

Figure 1:
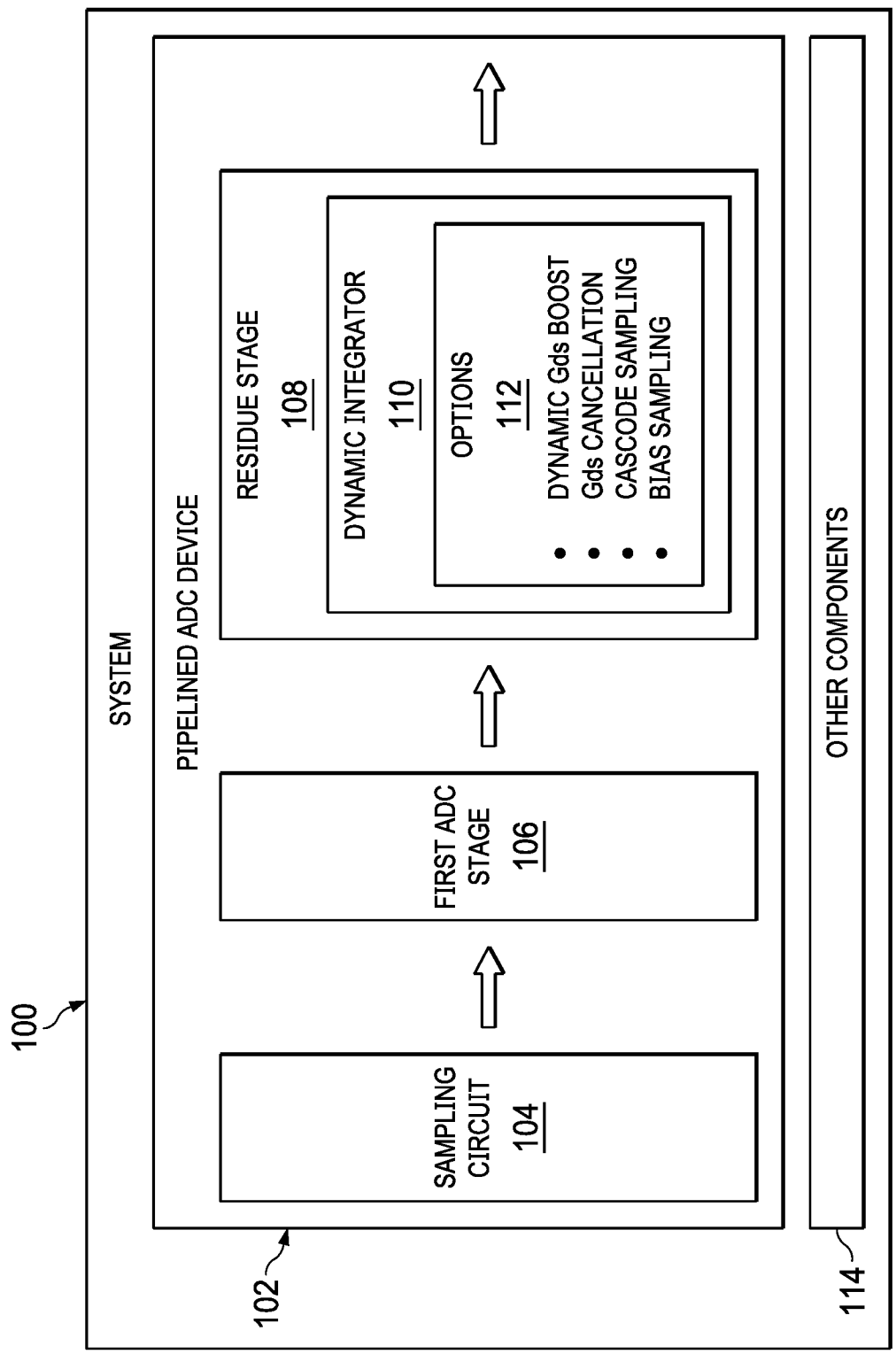
FIG. 1 is a block diagram showing a system with a pipelined analog-to-digital converter (ADC) device in accordance with various examples.

FIG. 1 is a block diagram showing a system 100 with a pipelined ADC device 102 in accordance with various examples. In FIG. 1, the system 100 represents an electrical system or consumer device that converts analog signals to digital signals using the pipelined ADC device 102. In different examples, the system 100 also includes other comprises other components 114 such as digital components, digital signal processors (DSPs), digital-to-analog converters (DACs) processors, and/or memory devices. Also, the pipelined ADC device 102 corresponds to an integrated circuit, a chip, a multi-die module, or a combination of integrated circuit components and discrete components.

As shown in FIG. 1, the pipelined ADC device 102 includes a sampling circuit 104 configured to sample an input signal (V_IN). In some examples, the sampling circuit 104 has a top plate sampling topology (a capacitor with a top plate that stores a charge based on V_IN and with a bottom plate coupled to a ground node). The pipelined ADC device 102 also includes a first ADC stage 106. In some examples, the first ADC stage is a stage 1 flash configured to provide a digital code based on the magnitude of V_IN provided by the sampling circuit 104. The digital code determined by the first ADC stage 106 is fed to DAC (e.g., part of the first ADC stage 106), and the analog output from the DAC is subtracted from V_IN. This "residue" is then amplified by a residue stage 108.

In the example of FIG. 1, the residue stage 108 includes a dynamic integrator 110 configured to perform amplification (e.g., transconductance amplification, where an input voltage is converted to an output current). In different examples, the dynamic integrator 110 includes one or more options 112 such as dynamic conductance (Gds) boost options, conductance cancellation options, cascode sampling options, and bias sampling options. In some examples, dynamic conductance boost operations related to options 112 result in high gain that is low power and insensitive to clock jitter. In some examples, conductance cancellation operations related to options 112 use an input cascode circuit for high gain and better tracking across process, voltage, and temperature (PVT) variations. In some examples, cascode sampling operations related to options 112 involve cascode sampling that is highly linear and low power for output sampling. In some examples, bias sampling operations related to options 112 reduce bias sampling sensitivity to the switching frequency of the dynamic integrator 110. With the one or more options 112, the dynamic integrator 110 achieves high gain and low power consumption, and avoids an output sampling switch. In some examples, the dynamic integrator has a gain of at least 16 in 100 ps, and a power consumption below 14 mA. In other dynamic integrator examples, the gain and power consumption varies. By comparison, an existing integrator achieves a gain of 6 in 100 ps with power consumption of 24 mA. Another existing integrator achieves a gain of 10 in 60 ps with power consumption of 32 mA.

Figure 2:
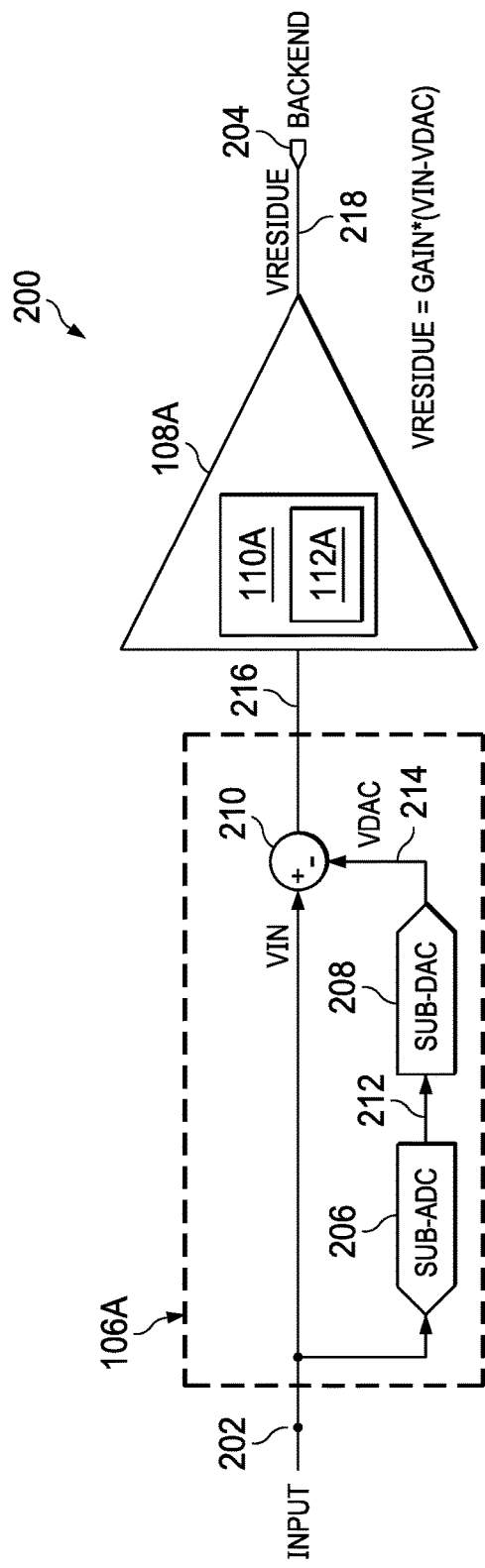
FIG. 2 is a schematic diagram showing an ADC scenario in accordance with various examples.

FIG. 2 is a schematic diagram showing a pipelined ADC scenario 200 in accordance with various examples. In the pipelined ADC scenario 200, various ADC components are represented including a first ADC stage 106A (an example of the first ADC 106 in FIG. 1), a residue stage 108A (an example of the residue stage 108 in FIG. 1), and backend components 204. As shown, the first ADC stage 106A comprises a sub-ADC stage 206 such as a stage 1 flash. The sub-ADC stage 206 provides a digital code 212 based on the magnitude of V_IN at node 202 (e.g., a sampling circuit node). The digital code 212 output from the sub-ADC stage 206 is provided to a sub-DAC stage 208, which converts the digital code 212 to an analog signal (VDAC) 214. VDAC 214 is provided to a subtraction block 210, which subtracts VDAC 214 from VIN.

The residue 216 from the subtraction block 210 is provided to a residue stage 108A that operates to amplify the residue 216. In the example of FIG. 2, the residue state 108A includes a dynamic integrator 110A with one or more options 112A (examples of the options 112 in FIG. 1). In different examples, the options 112A include dynamic conductance boost options, conductance cancellation options, cascode sampling options, and bias sampling options. In some examples, dynamic conductance boost operations related to options 112A result in high gain that is low power and insensitive to clock jitter. In some examples, conductance cancellation operations related to options 112A use an input cascode circuit for high gain and better tracking across PVT variations. In some examples, cascode sampling operations related to options 112A involve cascode sampling that is highly linear and low power for output sampling. In some examples, bias sampling operations related to options 112A result is bias sampling that is insensitive to the switching frequency of the dynamic integrator 110A. With the one or more options 112A, the dynamic integrator 110A achieves high gain and low power consumption, and avoids an output sampling switch. The output 218 from the residue stage 108A is labeled as Vresidue, where Vresidue=Gain*(Vin−VDAC). This output 218 is provided to the backend components 204, which perform subsequent ADC operations.

Figure 3:
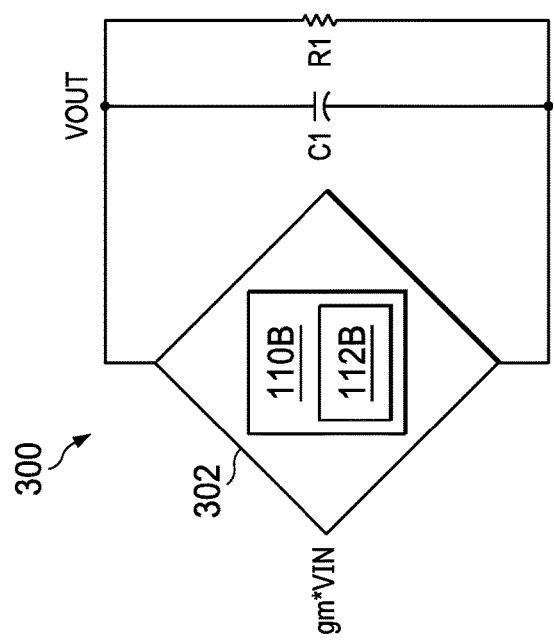
FIG. 3 is a schematic diagram showing a dynamic integrator scenario in accordance with various examples.

FIG. 3 is a schematic diagram showing a dynamic integrator scenario 300 in accordance with various examples. In the dynamic integrator scenario 300, a dynamic integrator 110B (an example of the dynamic integrator 110 in FIG. 1, or the dynamic integrator 110A) is part of a gain stage 302 in parallel with a capacitor, C1, and a resistor, R1, where the voltage across C1 is Vout, and where R1 represents the output impedance of the dynamic integrator. In some examples, the dynamic integrator scenario 300 is part of a residue stage (e.g., the residue stage 108 of FIG. 1, or the residue stage 108A of FIG. 1) of a pipelined ADC device (e.g., the pipelined ADC device 102 of FIG. 1).

In the example of FIG. 3, the dynamic integrator 110B includes one or more options 112B (examples of the options 112 in FIG. 1, or the options 112A in FIG. 2). In different examples, the options 112B include dynamic conductance boost options, conductance cancellation options, cascode sampling options, and bias sampling options. In some examples, dynamic conductance boost operations related to options 112B result in high gain that is low power and insensitive to clock jitter. In some examples, conductance cancellation operations related to options 112B use an input cascode circuit for high gain and better tracking across PVT variations. In some examples, cascode sampling operations related to options 112B involve cascode sampling that is highly linear and low power for output sampling. In some examples, bias sampling operations related to options 112B result in bias sampling that is insensitive to the switching frequency of the dynamic integrator 110B. With the one or more options 112B, the dynamic integrator 110B achieves high gain and low power consumption, and avoids an output sampling switch.

Figure 4:
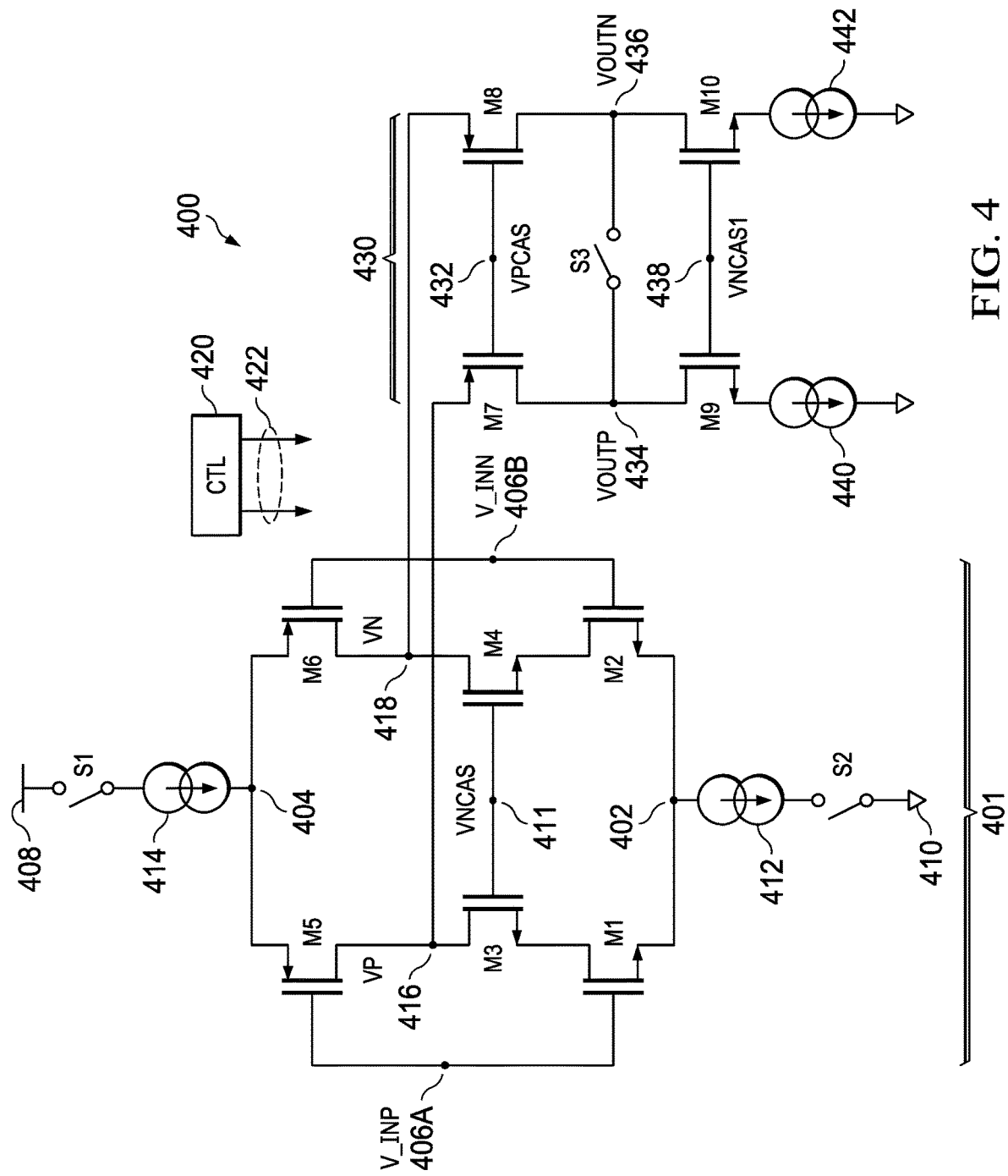
FIG. 4 is a schematic diagram showing a dynamic integrator circuit in accordance with various examples.

FIG. 4 is a schematic diagram showing a dynamic integrator circuit 400 in accordance with various examples. In different examples, the dynamic integrator circuit 400 represents at least some of the dynamic integrator 110 of FIG. 1, at least some of the dynamic integrator 110A of FIG. 2, or at least some of the dynamic integrator 110B of FIG. 3.

As shown, the residue amplifier circuit 400 includes a complementary metal-oxide semiconductor (CMOS) input stage 401 with a first differential pair of transistors, M1 and M2, and a second differential pair of transistors, M5 and M6. The CMOS input stage 401 also includes a pair of transistors, M3 and M4. As shown, the control terminals for M1 and M5 are coupled to a V_INP node 506A (e.g., to receive a residue signal such as the residue signal 216). Also, the control terminals for M2 and M6 are coupled to a V_INN node 506B (e.g., to receive a residue signal such as the residue signal 216). Meanwhile, the first current terminals of M5 and M6 are coupled to a current source node 404. As shown, a current source 414 coupled to the current source node 404 is coupled to a power supply node 408 via a switch, S1. Also, the second current terminals of M1 and M2 are coupled to a current source node 402. As shown, a current source 412 coupled to the current source node 402 is coupled to a ground node 410 via a switch, S2.

In the example of FIGS. 4, M3 and M4 have control terminals coupled to a VNCAS node 411, where a VNCAS signal at the VNCAS node 411 biases M3 and M4. Also, a first current terminal of M3 is coupled to a second current terminal of M5, while a second current terminal of M3 is coupled to a first current terminal of M1. Also, a first current terminal of M4 is coupled to a second current terminal of M6, while a second current terminal of M4 is coupled to a first current terminal of M2. Between the first terminal of M3 and the second terminal of M5 is a first node 416. Also, between the first terminal of M4 and the second terminal of M6 is a second node 418.

As shown in FIG. 4, a circuit 430 is coupled to the first and second node 416 and 418. The circuit 430 is the cascaded output folding branch which folds the input current (generated by the input CMOS transconductance) into the output. As shown, the circuit 430 includes a first pair of transistors, M7 and M8, and a second pair of transistors, M9 and M10. More specifically, the control terminals of M7 and M8 are coupled to a VPCAS node 432, where a VPCAS signal at the VPCAS node 432 biases M7 and M8. Also, the first current terminal of M7 is coupled to the first node 416, while the first current terminal of M8 is coupled to the second node 418. Also, the second current terminal of M7 is coupled to an output (VOUTP) node 434, while the second current terminal of M8 is coupled to an output (VOUTN) node 436. With regard to M9, the first current terminal of M9 is coupled to the output node 434, while the second current terminal of M9 is coupled to a bias current source 440. With regard to M10, the first current terminal of M10 is coupled to the output node 436, while the second current terminal of M10 is coupled to a bias current source 442.

During operations of the residue amplifier circuit 400, a controller 420 provides control signals to S1 and S2. More specifically, during an input sampling phase, S1 is high (login state '1'), while S2 is low (logic state '0'). During a gain phase, S1 is low (logic state '0'), while S2 is high (logic state '1'). In the example of FIG. 4, the switches connecting the current sources 412 and 414 to ground and supply respectively follow the switching pattern of S1 to be switched In some examples, the dynamic integrator circuit 400 is used to provide gain in a residue stage of a pipelined ADC as described herein, or to provide gain in another scenario. With the dynamic integrator circuit 400, gain is achieved with very low power consumption. In some examples, the dynamic integrator circuit 400 is modified and/or is combined with other circuits to achieve one or more options (e.g., options 112 in FIG. 1, options 112A in FIG. 2, or options 112B in FIG. 3), such as dynamic conductance boost options, conductance cancellation options, cascode sampling options, and bias sampling options. In some examples, a dynamic conductance boost circuit (see e.g., FIG. 5) is used with the dynamic integrator circuit 400 to achieve a high gain that is low power and insensitive to clock jitter. In some examples, an input cascode circuit (see e.g., FIGS. 8A and 8B) is used with the dynamic integrator circuit 400 for conductance cancellation, resulting in high gain and better tracking across PVT variations. In some examples, a cascode sampling circuit (see e.g., FIGS. 6A and 6B) is used with the dynamic integrator circuit 400 to achieve high linearity and low power for output sampling. In some examples, a bias sampling circuit (see e.g., FIGS. 7A and 7B) is used with the dynamic integrator circuit 400 to achieve bias sampling insensitivity to the switching frequency of the dynamic integrator circuit 400. With the one or more options for conductance boost operations, conductance cancellation operations, cascode sampling operations, and/or bias sampling operations, a dynamic integrator circuit such as the dynamic integrator circuit 400 achieves high gain and low power consumption, and avoids an output sampling switch.

Figure 5:
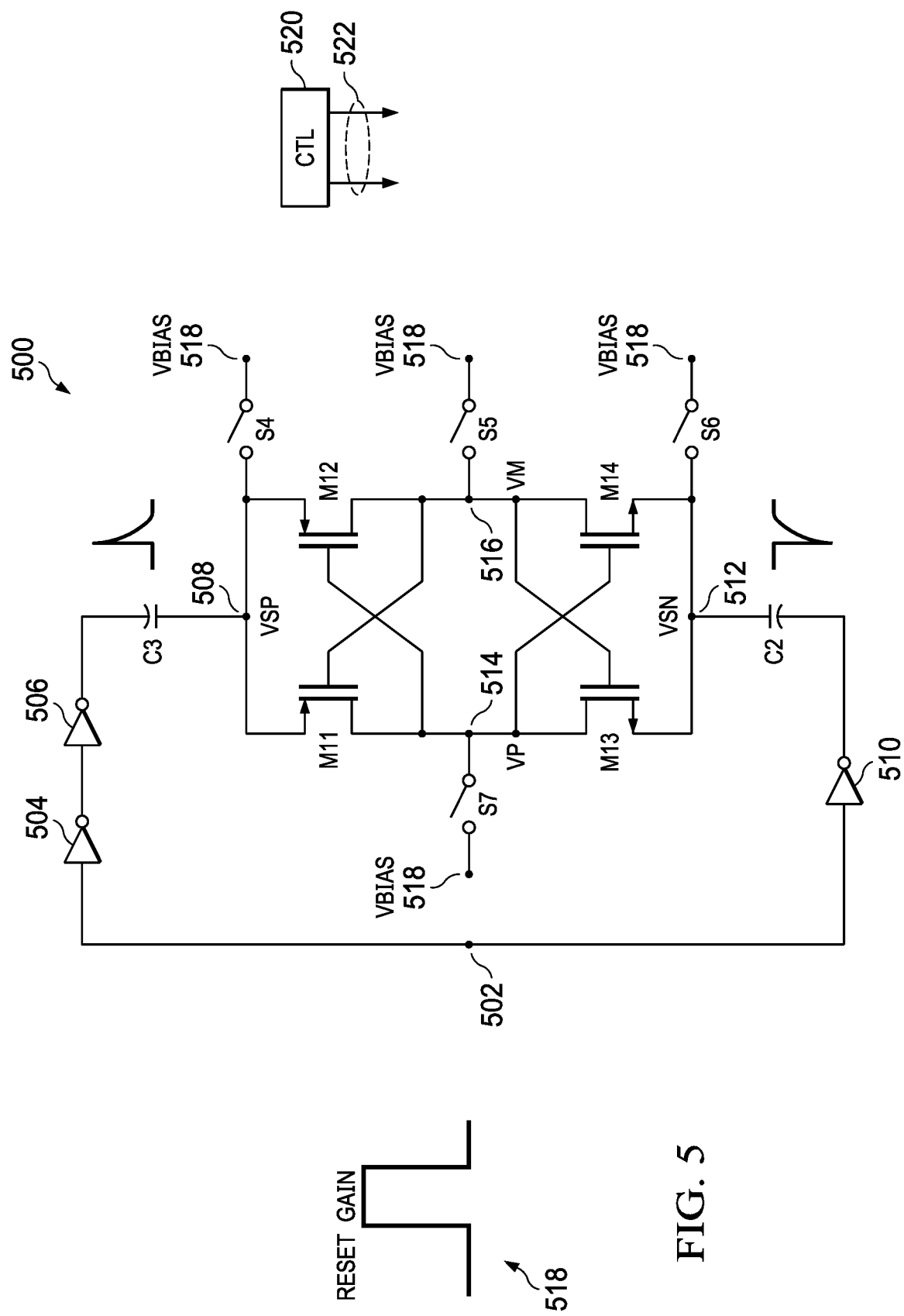
FIG. 5 is a schematic diagram showing a conductance cancellation circuit for a dynamic integrator in accordance with various examples.

FIG. 5 is a schematic diagram showing a conductance boost circuit 500 for use with a dynamic integrator such as the integrator circuit 400 of FIG. 4 in accordance with various examples. As shown, the conductance boost circuit 500 comprises four transistors, M11, M12, M13, and M14, each having a control terminal, a first current terminal, and a second current terminal. As shown, the first current terminals of M11 and M12 are coupled to node 508. Meanwhile, the second current terminals of M11 and M12 are coupled to the first current terminals of M13 and M14. Also, the second current terminals of M13 and M14 are coupled to node 512. Also, the control terminals of M11 and M13 are coupled to a node 516 between the second current terminal of M12 and the first current terminal of M14. Also, the control terminals of M12 and M14 are coupled to a node 514 between the second current terminal of M11 and the first current terminal of M13.

In the conductance boost circuit 500 of FIG. 5, a clock node 502 is coupled to the node 508 via a first inverter 504, a second inverter 506, and a capacitor, C3, in series. Also, the clock node 502 is coupled to the node 512 via a third inverter 510 and another capacitor, C2, in series. As represented in FIG. 5, the nodes 508, 512, 514, and 516, are coupled to a bias node 518 via respective switches, S4, S5, S6, and S7. More specifically, S4 is between the bias node 518 and the node 508, S5 is between the bias node 518 and the node 516, S6 is between the bias node 518 and the node 512, and S7 is between the bias node 518 and the node 514.

As shown, the conductance boost circuit 500 also includes a controller 520 configured to provide control signals 522. In some examples, the control signals 522 include a clock signal 518 that defines a reset phase and a gain phase for the conductance boost circuit 500. During the reset phase, S4, S5, S6, and S7 are high (logic state '1'). During the gain phase, S4, S5, S6, and S7 are low (logic state '0'). With the operations of the conductance boost circuit 500, a dynamic integrator (e.g., the dynamic integrator circuit 400 of FIG. 4) has high gain with low power and is insensitive to clock jitter. In one example, the nodes 514 and 516 of the conductance boost circuit 500 represented in FIG. 5 couple to the nodes 416 and 418 respectively of the dynamic integrator circuit 400 represented in FIG. 4.

In some examples, a pipelined ADC circuit (e.g., the pipelined ADC device 102 of FIG. 1) includes a dynamic integrator with a boost circuit such as the conductance boost circuit 500 of FIG. 5, where the boost circuit is configured to provide a time-varying conductance cancellation (as opposed to continuous time conductance cancellation). In some examples, a boost circuit (e.g., the conductance boost circuit 500) is configured to limit conductance cancellation to a portion of an integration interval. In some examples, a boost circuit (e.g., the conductance boost circuit 500) is configured to boost the output impedance of the transconductance of a dynamic integrator only during a first phase of an integration interval and is configured to turn off automatically after the first phase. In some examples, a boost circuit (e.g., the conductance boost circuit 500) comprises CMOS transistors.

In some examples, a boost circuit (e.g., the conductance boost circuit 500) comprises a first pair of differential transistors including a first transistor and a second transistor (e.g., M11 and M12 in FIG. 5). The boost circuit also comprises a second pair of differential transistors including a third transistor and a fourth transistor (e.g., M13 and M14 in FIG. 5). The boost circuit also comprises a switch arrangement with switches (e.g., S4, S5, S6, S7 in FIG. 5) coupled between a bias node (e.g., the bias node 518 in FIGS. 5) and first and second current terminals of each of the first transistor, second transistor, third transistor, and fourth transistor (e.g., M11, M12, M13, and M14 in FIG. 5).

In some examples, a boost circuit comprises two inverters (e.g., the inverters 504 and 506 in FIG. 5) and a first capacitor (e.g., C3 in FIG. 5) coupled between a clock signal node (e.g., node 502 in FIG. 5) and the first current terminals of the first and second transistors (e.g., M11 and M12 in FIG. 5). Also, in some examples, a boost circuit comprises one inverter (e.g., the inverter 510 in FIG. 5) and a second capacitor (e.g., C2 in FIG. 5) coupled between the clock signal node (e.g., the node 502 in FIG. 5) and the second current terminals of the third and fourth transistors (e.g., M13 and M14 in FIG. 5). In some examples, the control terminals of the first and third transistors (e.g., M11 and M13 in FIG. 5) are coupled to the second current terminal of the second transistor (e.g., M12 in FIG. 5) and to the first current terminal of the fourth transistor (e.g., M14 in FIG. 5), and wherein the control terminals of the second and fourth transistors (e.g., M12 and M14 in FIG. 5) are coupled to the second current terminal of the first transistor (e.g., M11 in FIG. 5) and to the first current terminal of the third transistor (e.g., M13 in FIG. 5).

Figure 6A:
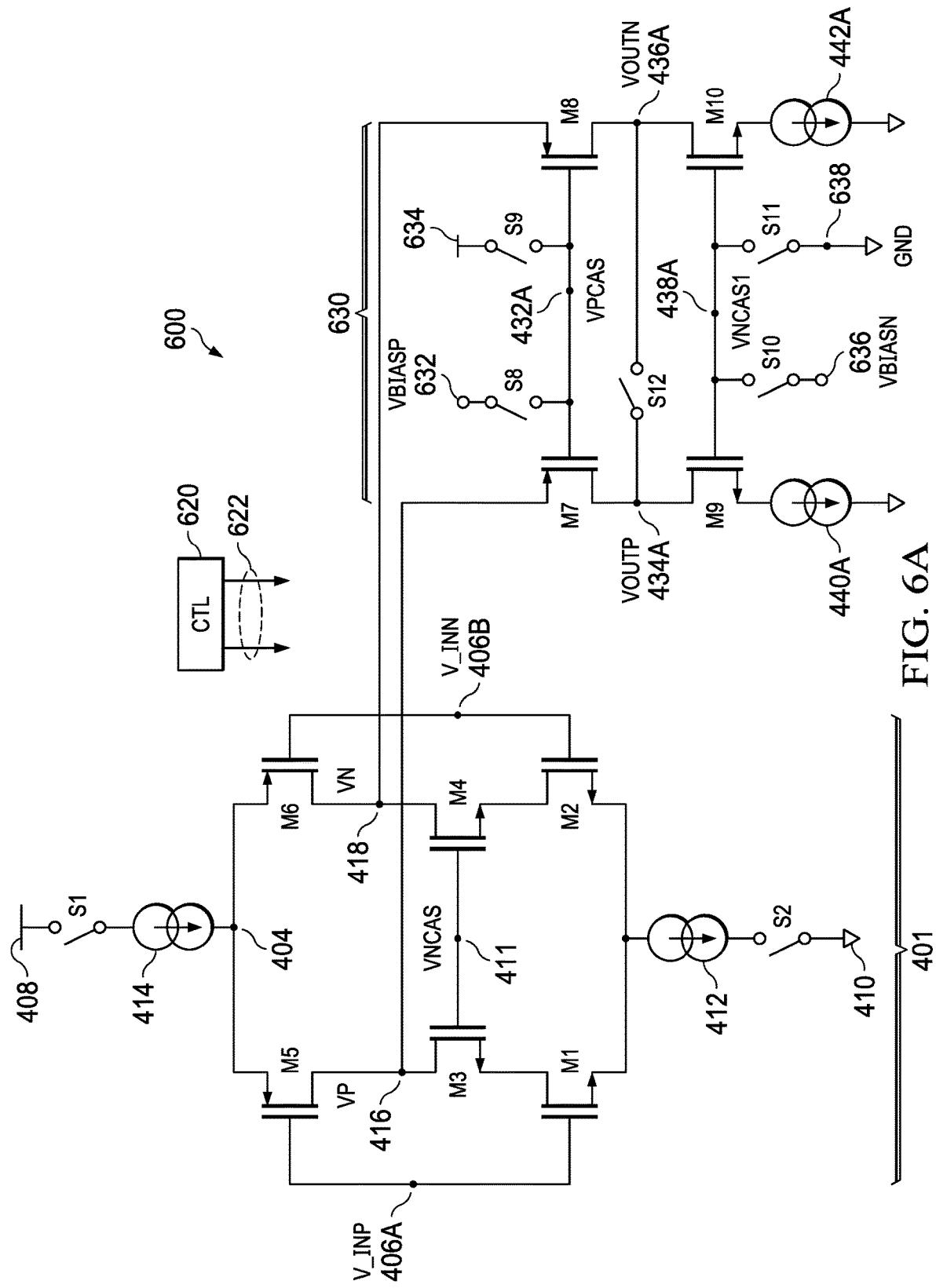
FIG. 6A is a schematic diagram showing a dynamic integrator circuit with a cascode sampling circuit in accordance with various examples.

FIG. 6A is a schematic diagram showing a dynamic integrator circuit 600 with a cascode sampling circuit 630 in accordance with various examples. In FIG. 6A, the dynamic integrator circuit 600 includes the CMOS input stage 401 described for FIG. 4, where the cascode sampling circuit 630 is coupled to nodes 416 and 418 of the CMOS input stage 401. As shown, the cascode sample circuit 630 includes M7 and M8, each having a control terminal, a first current terminal, and second current terminal. More specifically, the control terminals of M7 and M8 are coupled to a VPCAS node 432A (an example of the VPCAS node 430 of FIG. 4). The signal at the VPCAS node 432A is either VBIASP or a power supply depending on the operations of switches, S8 and S9, where S8 is coupled between the VPCAS node 432A and a VBIASP node 632, and where S9 is coupled between the VPCAS node 432A and a power supply node 634.

As shown, the first current terminal of M7 is coupled to the node 416, and the second current terminal of M7 is coupled to an output (VOUTP) node 434A (an example of the output node 434 in FIG. 4). Meanwhile, the first current terminal of M8 is coupled to the node 418, and the second current terminal of M8 is coupled to an output (VOUTN) node 436A (an example of the output node 436 in FIG. 4).

In the example of FIG. 6A, the cascode sampling circuit 630 also includes a pair of transistors, M9 and M10, each having a control terminal, a first current terminal, and second current terminal. More specifically, the control terminals of M9 and M10 are coupled to a VNCAS node 438A (an example of the VNCAS node 438 in FIG. 4). The signal at the VNCAS node 438A is either VBIASN or ground depending on the operations of switches, S10 and S11, where S10 is coupled between the VNCAS node 438A and a VBIASN node 636, and where S11 is coupled between the VNCAS node 438A and a ground node 638. The first current terminal of M9 is coupled to the output node 434A, and the second current terminal of M9 is coupled to a bias current source 440A (an example of the bias current source 400 in FIG. 4) Meanwhile, the first current terminal of M10 is coupled to the output node 436A, and the second current terminal of M10 is coupled to a bias current source 442A (an example of the bias current source 442 in FIG. 4. Between the output nodes 434A and 436A is a switch S12.

Figure 6B:
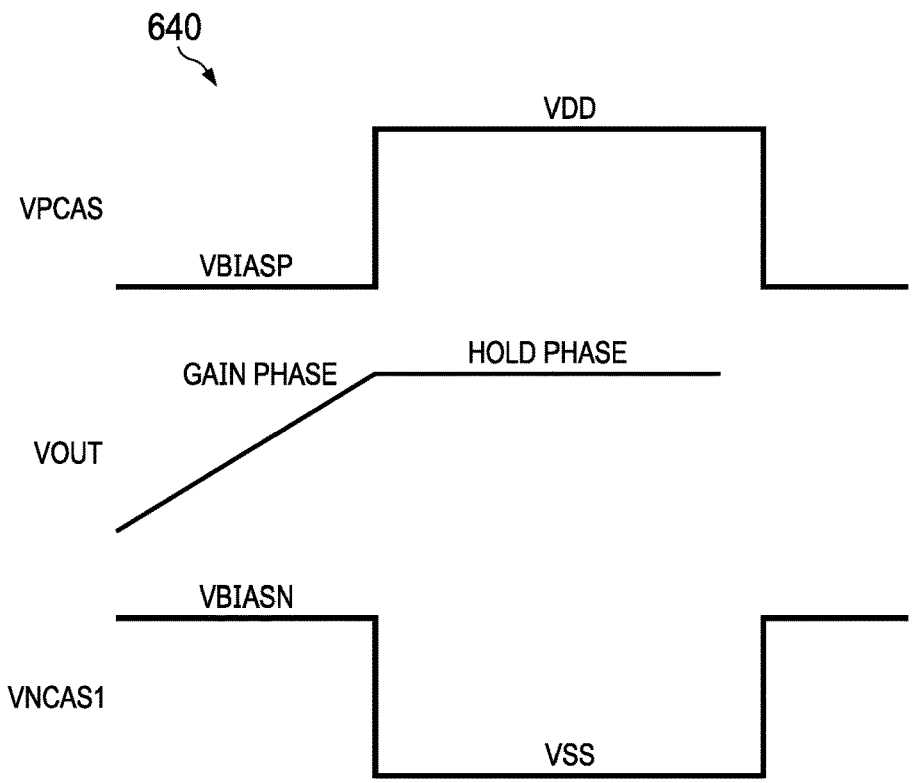
FIG. 6B is a timing diagram showing control signals for the cascode sampling circuit of FIG. 6A in accordance with various examples.

As shown in FIG. 6A, the dynamic integrator circuit 600 also includes a controller 620 configured to provide control signals 622 for the various switches (e.g., S1, S2, S8-S12). FIG. 6B is a timing diagram 640 showing control signals for the dynamic integrator circuit 600 of FIG. 6A in accordance with various examples. The timing diagram 640 also shows VOUT as a function of the controls signals. More specifically, in the timing diagram 640, VPCAS is low and VNCAS1 is high during a gain phase, resulting in an increasing VOUT. As used herein, VNCAS and VNCAS1 are two different bias voltages due to the two sets of transistors (M3, M4; and M9, M10) having different biasing conditions. During a hold phase, VNCAS is low (set to VSS) and VPCAS is high (set to VDD), resulting in VOUT being maintained during the hold phase. As used herein, the "gain phase" and the "integration phase" refer to the same time window. Also, the "output sampling phase" and the "hold phase" refer to the time window.

With the cascade sampling circuit 630, a dynamic integrator such as the dynamic integrator circuit 400 is highly linear with low power output sampling. In some examples, a pipelined ADC circuit (e.g., the pipelined ADC device 102 in FIG. 1) includes a dynamic integrator with a cascode sampling circuit (e.g., the dynamic integrator circuit 600 with a cascode sampling circuit 630 as in FIG. 6A), wherein the cascode sampling circuit is re-used to sample an output of the dynamic integrator.

In some examples, a pipelined ADC circuit (e.g., the pipelined ADC device 102 of FIG. 1) includes a dynamic integrator with a cascode sampling circuit such as the cascode sampling circuit 630 of FIG. 6A. In some examples, a cascode sampling circuit comprises a first pair of differential transistors including a fifth transistor and a sixth transistor (e.g., M7 and M8 in FIG. 6A), and a second pair of differential transistors including a seventh transistor and an eighth transistor (e.g., M9 and M10 in FIG. 6A). In some examples, a cascode sampling circuit also comprises a switch arrangement with a first switch (e.g., S8 in FIG. 6A) coupled between a positive bias node (e.g., node 632 in FIG. 6A) and control terminals of the fifth transistor and a sixth transistor (e.g., M7 and M8 in FIG. 6A), In some examples, the switch arrangement for a cascode sampling circuit also comprises a second switch (e.g., S9 in FIG. 6A) coupled between a power supply node (e.g., node 634 in FIG. 6A) and the control terminals of the fifth transistor and the sixth transistor (e.g., M7 and M8 in FIG. 6A). In some examples, the switch arrangement for a cascode sampling circuit also comprises a third switch (e.g., 510 in FIG. 6A) coupled between a negative bias node (e.g., node 636 in FIG. 6A) and control terminals of the seventh and eighth transistors (e.g., M9 and M10 in FIG. 6A). In some examples, the switch arrangement for a cascode sampling circuit also comprises a fourth switch (e.g., S11 in FIG. 11) coupled between a ground node (e.g., node 638 in FIG. 6A) and control terminals of the seventh and eighth transistors (e.g., M9 and M10 in FIG. 6A).

Figure 7A:
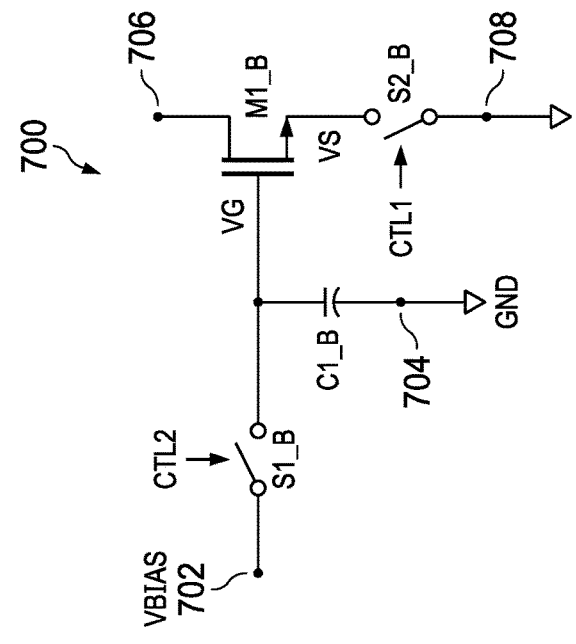
FIG. 7A is a schematic diagram showing a bias sampling circuit for use with a dynamic integrator in accordance with various examples.

FIG. 7A is a schematic diagram showing a bias sampling circuit 700 for use with a dynamic integrator in accordance with various examples. As shown, the bias sampling circuit 700 includes a transistor (M1_B) with a control terminal coupled to bias node 702 via a sampling switch (S1_B). The control terminal of M1_B also is coupled to the top plate of a capacitor, C1_B. The bottom plate of C1_B is coupled to a ground node 704. Meanwhile, the first current terminal of M1_B is coupled to a node 706, and the second current terminal of M1_B is coupled to a ground node 708 via a switch, S2_B.

Figure 7B:
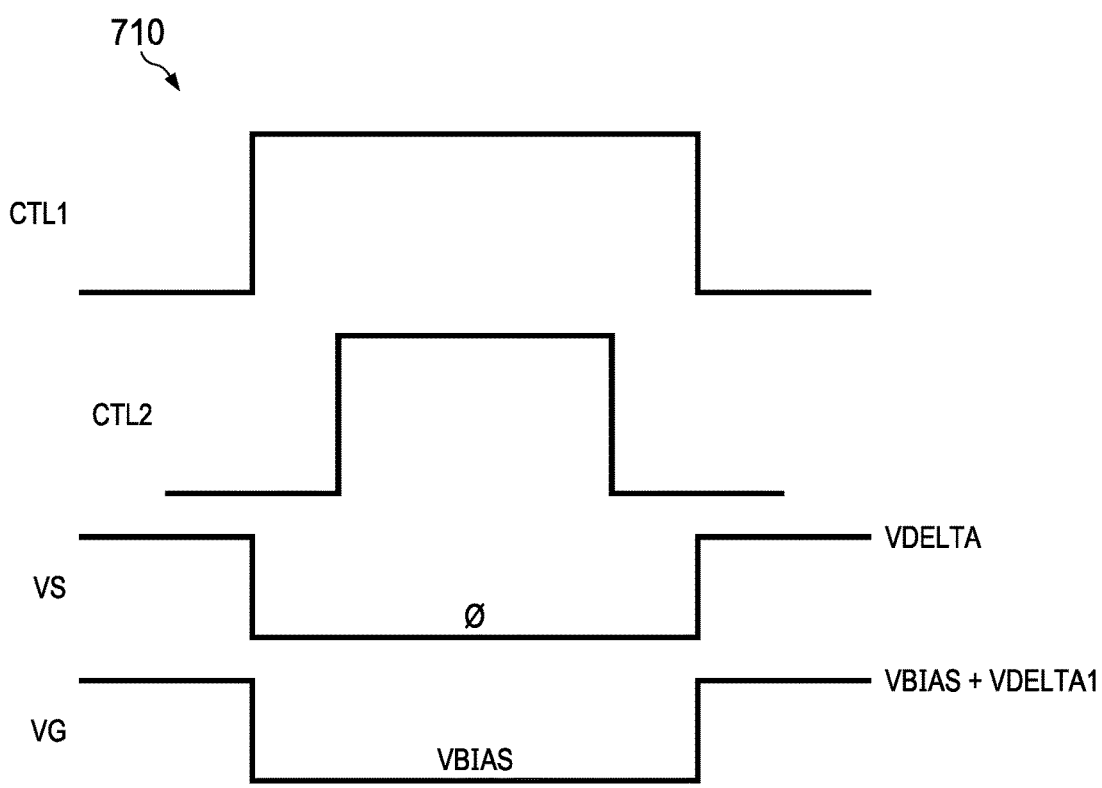
FIG. 7B is a timing diagram showing signals related to the bias sampling circuit of FIG. 7A in accordance with various examples.

FIG. 7B is a timing diagram 710 showing signals related to the bias sampling circuit of FIG. 7A in accordance with various examples. In the timing diagram 710, when the control signal (CTL1) for S2_B transitions from low-to-high, S2_B closes and the source voltage (VS) for M1_B transitions from Vdelta to ground (e.g., zero). Also, when CTL1 transitions from high-to-low, the gate voltage (VG) for M1_B transitions from VBIAS+Vdelta1 to VBIAS. Later, when CTL1 transitions from high-to-low, S2_B is open and VS for M1_B transitions from ground to Vdelta. Also, when CTL1 transitions from high-to-low, VG for M1_B transitions from VBIAS to VBIAS+Vdelta1. While CTL1 is high, CTL2 transition from low-to-high and from high-to-low with some offset between CTL1 transitions and CTL2 transitions. With a bias sampling circuit, such as the bias sampling circuit 700, bias sampling is insensitive to switching currents, and power consumption is low as bandwidths are maintained low.

In some examples, with a bias sampling circuit such as the bias sampling circuit 700, all the bias nodes are sampled on to a large capacitor. The sampling switch (e.g., S1_B) is closed during the period where there is no disturbance. Before switching of the integrator, the sampling switch (S1_B) is opened. As the bias node is now floating, charge is conserved. The voltage is restored in a full period (as switching on/off sequence compensates for the voltage disturbances). Related switches only need to provide leakage currents, hence are sized smaller. Also, the refresh rate is similar to the integrator switching rate. No apparent high bandwidth nodes, yet insensitive to the aperiodic switching.

In the bias sampling circuit 700, S1_B sets the gate voltage to a target VBIAS during powerup and also to refresh the voltage to account for losses due to leakage when S1_B is off. With the bias sampling circuit 700, bias sampling for a dynamic integrator such as the dynamic integrator circuit 400 is insensitive to the switching frequency of the dynamic integrator.

In some examples, a pipelined ADC circuit (e.g., the pipelined ADC device 102 of FIG. 1) includes a dynamic integrator with a bias sampling circuit such as the bias sampling circuit 700 of FIG. 7A. In some examples, the bias sampling circuit is configured to sample all bias nodes to a capacitor. In some examples, the bias sampling circuit comprises a sampling switch that is closed when a disturbance parameter is less than a threshold. In some examples, the bias sampling circuit comprises a sampling switch that is open before switching of the dynamic integrator.

In some examples, a bias sampling circuit comprises a sampling switch (e.g., S1_B in FIG. 7A), a bias sampling capacitor (e.g., C1-B in FIG. 7A), and a bias sampling circuit transistor (e.g., M1_B in FIG. 7A) with a control terminal coupled to the bias sampling switch and to a top plate of the bias sampling capacitor. A bottom plate of the bias sampling capacitor is coupled to a ground node. In some examples, a bias sampling circuit also comprises a ground switch (e.g., S2_B in FIG. 7A) between a second current terminal of the bias sampling circuit transistor (e.g., M1_B in FIG. 7A) and a ground node.

Figure 8A:
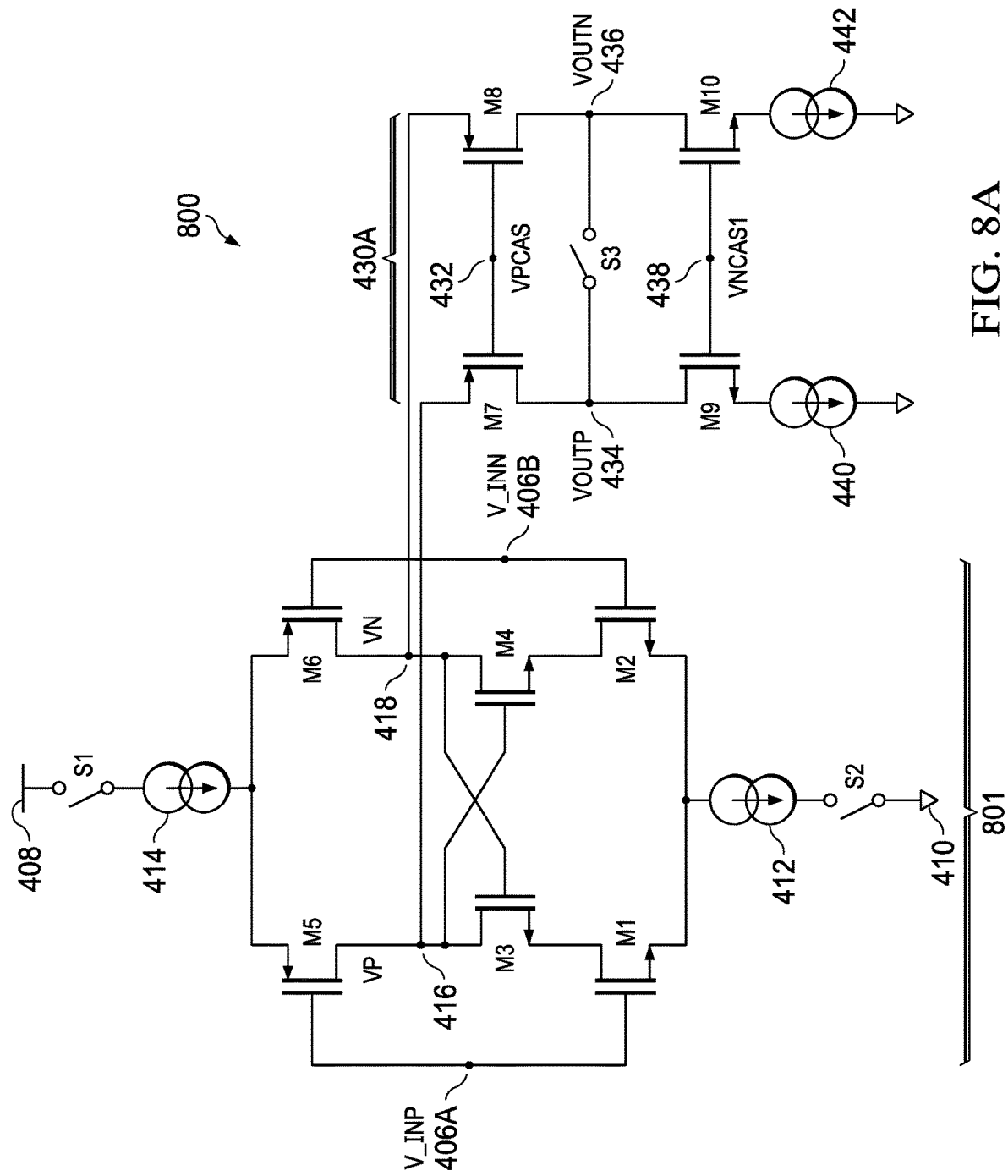
FIG. 8A is a schematic diagram showing a dynamic integrator circuit with input cascodes for conductance cancellation in accordance with various examples.

FIG. 8A is a schematic diagram showing a dynamic integrator circuit 800 with input cascodes for conductance cancellation in accordance with various examples. As shown, the dynamic integrator circuit 800 includes a CMOS input stage 801 similar to the CMOS input stage 401 of FIG. 4. The difference between the CMOS input stage 801 and the CMOS input stage 401 is that in the CMOS input stage 801, the control terminals of M3 and M4 are coupled to different nodes. More specifically, for the CMOS input stage 801 of FIG. 8A, the control terminal of M3 is coupled to the node 418 (VN in the control signal for M3 in FIG. 8A), and the control terminal of M4 is coupled to the node 416 (VP is the control signal for M4 in FIG. 8A). In contrast, for the CMOS input stage 401 of FIG. 4, the control terminals of M3 and M4 are coupled to a VNCAS node 411. As shown in FIG. 8A, the other components of the CMOS input stage 801 follow the description provided for the CMOS input stage 401. Also, the circuit 430A in FIG. 8A is an example of the circuit 430 in FIG. 4.

Figure 8B:
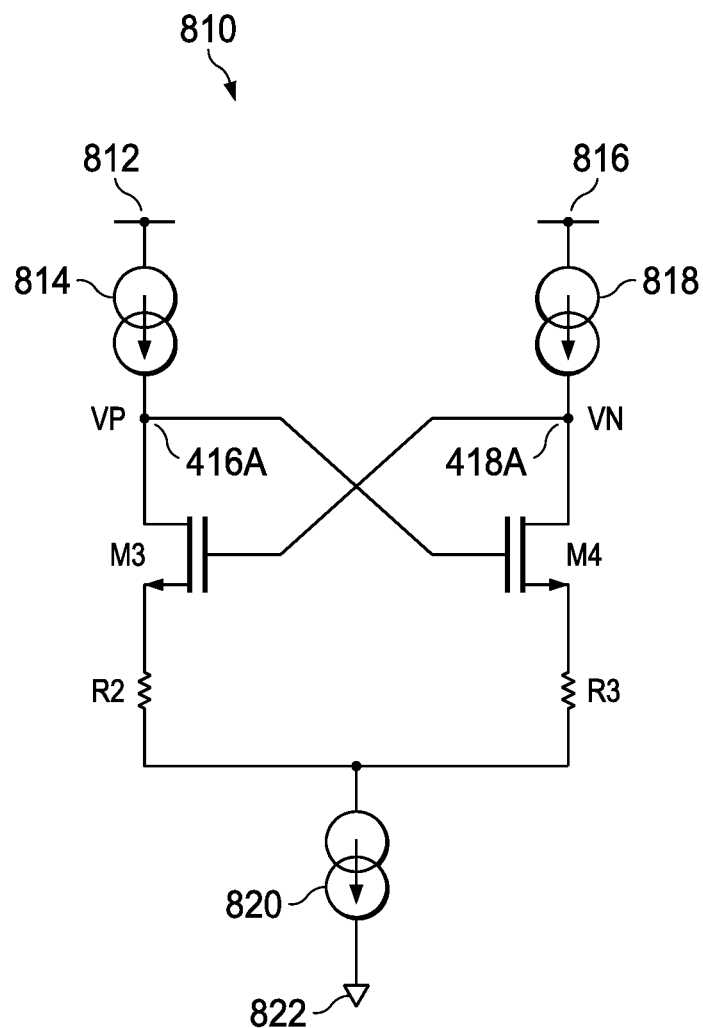
FIG. 8B is a schematic diagram showing a differential impedance circuit related to the dynamic integrator circuit of FIG. 8A in accordance with various examples.

FIG. 8B is a schematic diagram showing a differential impedance circuit 810 related to the dynamic integrator circuit of FIG. 8A in accordance with various examples. As shown, the differential impedance circuit 810 includes M3, where a first current terminal of M3 is coupled to a node 416A (an example of the node 416 in FIG. 8A). As shown, the node 416A is coupled to a current source 814, where the current source 814 is coupled to a power supply node 812. Meanwhile, a second current terminal of M3 is coupled to one side of a resistor, R2, where the other side of R2 is coupled to a current source 820, and where the current source 820 is coupled to a ground node 822.

As shown, the differential impedance circuit 810 includes M4, where a first current terminal of M4 is coupled to a node 418A (an example of the node 418 in FIG. 8A). As shown, the node 418A is coupled to a current source 818, where the current source 818 is coupled to a power supply node 816. Meanwhile, a second current terminal of M4 is coupled to one side of a resistor, R3, where the other side of R3 is coupled to the current source 820. For the differential impedance circuit 810, R2 and R3 have the value 1/Gds, where Gds is the conductance of M1 and M2. With the differential impedance circuit 810, the differential impedance looking into VP, VM is −Gds (assuming gm is much greater than Gds).

With a dynamic integrator having input cascodes configured for conductance cancellation as does the dynamic integrator 800 of FIG. 8, input cascodes are re-configured to cancel input conductance. By re-using the input cascodes, low power and area efficiency are achieved. More specifically, in some examples, input PMOS conductance is partially canceled by input NMOS conductance. Thus, a dynamic integrator having input cascodes configured for conductance cancellation enables high gain and better tracking across PVT variations.

Figure 9:
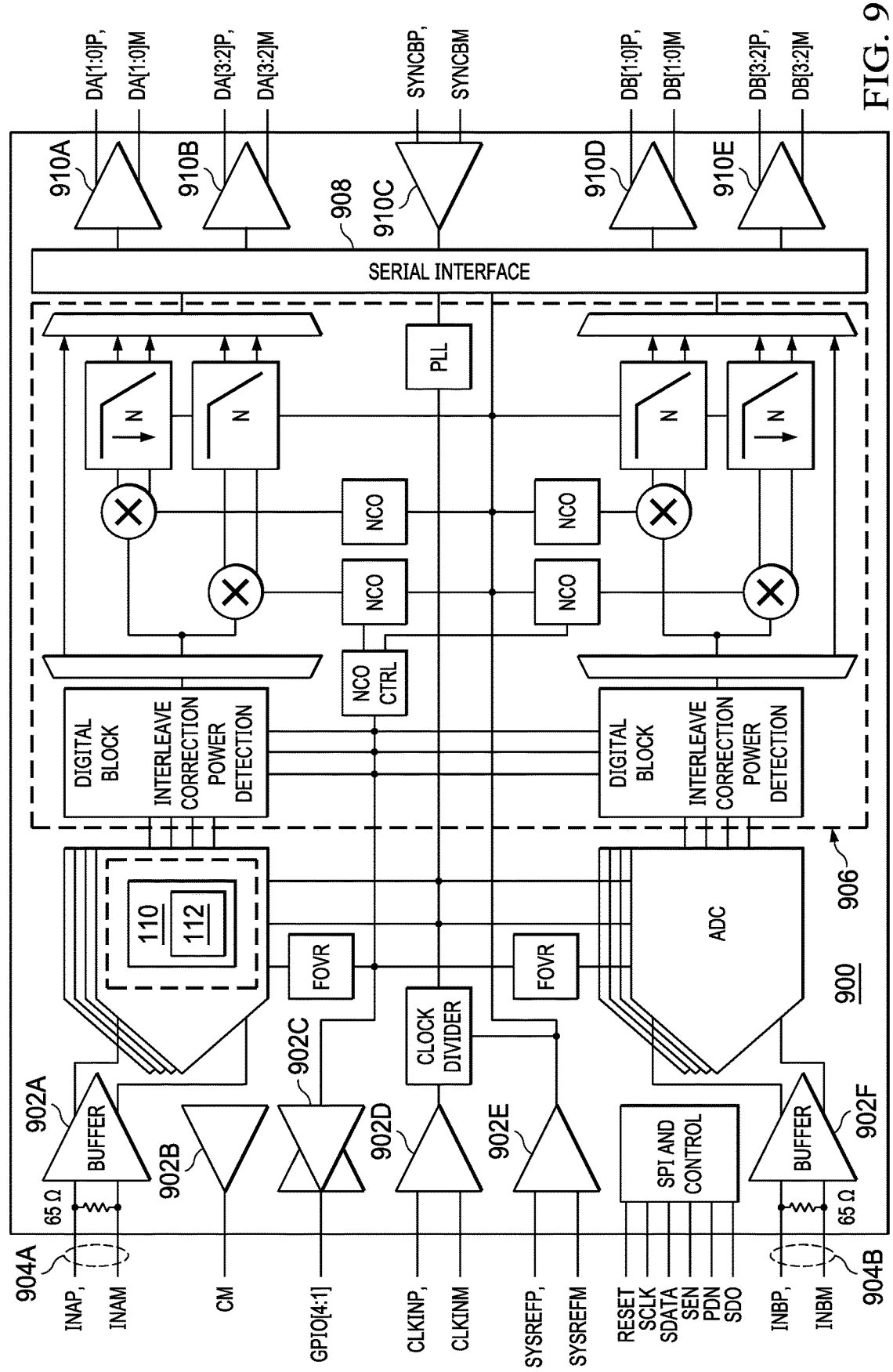
FIG. 9 is a block diagram showing an ADC device in accordance with various examples.

FIG. 9 is a block diagram of an ADC device 900 in accordance with various examples. In the example of FIG. 9, the ADC device represents a dual-channel ADC device, where at least one of the channels includes pipelined ADC logic with a dynamic integrator 110 having one or more of the options 112 and/or circuits (e.g., the circuit 400 of FIG. 4, the circuit 500 of FIG. 5, the circuit 600 of FIG. 6A, the circuit 700 of FIG. 7A, and/or the circuit 800 of FIG. 8A) described herein. In some examples, the ADC device 900 supports radio frequency (RF) sampling with input frequencies up to 4 Ghz or more. In some examples, the ADC device 900 has a low noise spectral density (on the order of −155 dBFS/Hz) as well as dynamic range and channel isolation over a large input frequency range.

As shown, the ADC device 900 includes various buffers 902A-902F to buffer the analog input, where on-chip termination provides uniform input impedance across a wide frequency range and minimizes sample-and-hold glitch energy. Each of the ADC channels 904A and 904B can be connected to a dual-band, digital down-converter (DDC) 906 with up to three independent, 16-bit numerically-controlled oscillators (NCOs) per DDC for phase-coherent frequency hopping. Additionally, the ADC device 900 is equipped with frontend peak and RMS power detectors and alarm functions to support external automatic gain control (AGC) algorithms. At the output of the ADC device 900, a serial interface 908 (e.g., to support a subclass 1-based deterministic latency using data rates up to 12.5 Gbps with up to four lanes per ADC) and output buffers 910A-910E are used.

The ADC device 900 is merely an example and is not intended to limit uses of a dynamic integrator with one or more of the options 112 (e.g., dynamic conductance boost options, conductance cancellation options, cascode sampling options, and bias sampling options) and/or circuits (e.g., the circuit 400 of FIG. 4, the circuit 500 of FIG. 5, the circuit 600 of FIG. 6A, the circuit 700 of FIG. 7A, and/or the circuit 800 of FIG. 8A) described herein. In some examples, dynamic conductance boost operations related to options 112 result in high gain that is low power and insensitive to clock jitter. In some examples, conductance cancellation operations related to options 112 use an input cascode circuit for high gain and better tracking across PVT variations. In some examples, cascode sampling operations related to options 112 involve cascode sampling that is highly linear and low power for output sampling. In some examples, bias sampling operations related to options 112 reduce bias sampling sensitivity to the switching frequency of the dynamic integrator 110. With the one or more options 112, a dynamic integrator such as the dynamic integrator 110 achieves high gain and low power consumption, and avoids an output sampling switch.

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device is coupled to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A pipelined analog-to-digital converter (ADC) circuit, comprising:
   a first ADC stage;
   a residue stage coupled to the first ADC stage, wherein the residue stage comprises:
      a dynamic integrator configured to provide transconductance, wherein the dynamic integrator includes a boost circuit configured to boost an output impedance of the transconductance.

2. The pipelined ADC circuit of claim 1, wherein the boost circuit is configured to provide a time-varying conductance cancellation.

3. The pipelined ADC circuit of claim 2, wherein the boost circuit is configured to limit conductance cancellation to a portion of an integration interval.

4. The pipelined ADC circuit of claim 1, wherein the boost circuit is configured to boost the output impedance of the transconductance only during a first phase of an integration interval and to turn off automatically after the first phase.

5. The pipelined ADC circuit of claim 1, wherein the boost circuit comprises complementary metal-oxide-semiconductor (CMOS) transistors.

6. The pipelined ADC circuit of claim 1, wherein the dynamic integrator further comprises a cascode sampling circuit, wherein the cascode sampling circuit is re-used to sample an output of the dynamic integrator.

7. The pipelined ADC circuit of claim 1, wherein the dynamic integrator further comprises a bias sampling circuit.

8. The pipelined ADC circuit of claim 7, wherein the bias sampling circuit is configured to sample all bias nodes to a capacitor.

9. The pipelined ADC circuit of claim 7, wherein the bias sampling circuit comprises a sampling switch that is closed when a disturbance parameter is less than a threshold.

10. The pipelined ADC circuit of claim 7, wherein the bias sampling circuit comprises a sampling switch that is open before switching of the dynamic integrator.

11. The pipelined ADC circuit of claim 1, wherein the dynamic integrator further comprises an input conductance cancellation circuit.

12. The pipelined ADC circuit of claim 11, wherein the input conductance cancellation circuit is configured to cancel at least some input p-type metal-oxide semiconductor (PMOS) conductance using input p-type metal-oxide semiconductor (NMOS) conductance.

13. The pipelined ADC circuit of claim 11, wherein the input conductance cancellation circuit is configured to re-configure input cascodes to perform input conductance cancellation.

14. A dynamic integrator circuit, comprising:
   a complementary metal-oxide-semiconductor (CMOS) input stage; and
   a conductance boost circuit coupled to the CMOS input stage, wherein the conductance boost circuit comprises:
      a first pair of differential transistors including a first transistor and a second transistor;
      a second pair of differential transistors including a third transistor and a fourth transistor; and
      a switch arrangement with switches coupled between a bias node and first and second current terminals of each of the first transistor, second transistor, third transistor, and fourth transistor.

15. The dynamic integrator circuit of claim 14, wherein the conductance boost circuit further comprises:
   two inverters and a first capacitor coupled between a clock signal node and the first current terminals of the first and second transistors; and
   one inverter and a second capacitor coupled between the clock signal node and the second current terminals of the third and fourth transistors.

16. The dynamic integrator circuit of claim 14, wherein the control terminals of the first and third transistors are coupled to the second current terminal of the second transistor and to the first current terminal of the fourth transistor, and wherein the control terminals of the second and fourth transistors are coupled to the second current terminal of the first transistor and to the first current terminal of the third transistor.

17. The dynamic integrator circuit of claim 14, further comprising a cascode sampling circuit coupled to the CMOS input stage, wherein the cascode sampling circuit comprises:
a first pair of differential transistors including a fifth transistor and a sixth transistor;
a second pair of differential transistors including a seventh transistor and an eighth transistor;
a switch arrangement with a first switch coupled between a positive bias node and control terminals of the fifth transistor and a sixth transistor, a second switch coupled between a power supply node and the control terminals of the fifth transistor and the sixth transistor, a third switch coupled between a negative bias node and control terminals of the seventh and eighth transistors, and a fourth switch coupled between a ground node and control terminals of the seventh and eighth transistors.

18. The dynamic integrator circuit of claim 17, wherein the cascode sampling circuit is configured to provide input conductance cancellation.

19. The dynamic integrator circuit of claim 14, further comprising a bias sampling circuit that comprises a bias sampling switch, a bias sampling capacitor, and a bias sampling transistor with a control terminal coupled to the bias sampling switch and a top plate of the bias sampling capacitor, wherein a bottom plate of the bias sampling capacitor is coupled to a ground node.

20. The dynamic integrator circuit of claim 19, further comprising a ground switch between a second current terminal of the bias sampling circuit transistor and a ground node.

* * * * *